United States Patent
Holzer et al.

[11] Patent Number: 5,925,413
[45] Date of Patent: Jul. 20, 1999

[54] METHOD OF DEPOSITING A POLYCRYSTALLINE DIAMOND LAYER ON A NITRIDE SUBSTRATE

[75] Inventors: Hermann Holzer, Furth; Roland Haubner, Wr. Neudorf; Benno Lux; Helmut Nechansky, both of Wien, all of Austria

[73] Assignee: Electrovac, Fabrikation elektrotechnischer Spezialartikel Gesellschaft m.b.H., Klosterneuburg, Austria

[21] Appl. No.: 08/823,598

[22] Filed: Mar. 25, 1997

[30] Foreign Application Priority Data

Mar. 25, 1996 [AT] Austria ........................ 539/96

[51] Int. Cl.⁶ .............................. C23C 16/26; B05D 3/10
[52] U.S. Cl. .......................... 427/249; 427/307; 427/577; 427/122
[58] Field of Search .................... 427/249, 577, 427/575, 122, 309, 307

[56] References Cited

U.S. PATENT DOCUMENTS

| | | |
|---|---|---|
| 4,919,974 | 4/1990 | McCune et al. . |
| 5,082,359 | 1/1992 | Kirkpatrick . |
| 5,100,703 | 3/1992 | Saijo et al. . |
| 5,236,740 | 8/1993 | Peters et al. ........................ 427/249 |
| 5,304,424 | 4/1994 | Herb et al. . |
| 5,427,826 | 6/1995 | Iida . |
| 5,458,927 | 10/1995 | Malaczynski et al. . |

FOREIGN PATENT DOCUMENTS

| | | |
|---|---|---|
| 100 232 B1 | 2/1984 | European Pat. Off. . |
| 374 923 A2 | 6/1990 | European Pat. Off. . |
| 445 305 A1 | 9/1991 | European Pat. Off. . |
| 500 253 A1 | 8/1992 | European Pat. Off. . |
| 519 587 B1 | 12/1992 | European Pat. Off. . |
| 617 140 A1 | 9/1994 | European Pat. Off. . |
| 628 642 A1 | 12/1994 | European Pat. Off. . |
| 660 400 A1 | 6/1995 | European Pat. Off. . |
| 44 12 524 A1 | 11/1994 | Germany . |
| 61-006199 | 1/1986 | Japan . |
| 3-141197 | 6/1991 | Japan . |
| 2 253 416 | 9/1992 | United Kingdom . |
| 2 295 401 | 5/1996 | United Kingdom . |
| 2 304 982 | 3/1997 | United Kingdom . |
| WO 93/22482 | 11/1993 | WIPO . |
| WO 95/02078 | 1/1995 | WIPO . |
| WO 95/27806 | 10/1995 | WIPO . |

OTHER PUBLICATIONS

"Effective thermal resistance at diamond boundaries in mems", Kenneth E. Goodson et al, Proceedings of the ASME Dynamic System and Control Division ASME 1995, pp. 925–930, No month data!.

Primary Examiner—Roy V. King
Attorney, Agent, or Firm—Henry M. Feiereisen

[57] ABSTRACT

A method of depositing a polycrystalline diamond layer on a nitride substrate is disclosed, which comprises chemically-etching the nitride substrate with a KOH or NaOH solution or melt and depositing the polycrystalline diamond layer on the nitride substrate from a vapor phase, wherein the etching temperature, time and concentration of the etchant are controlled so that at least 75% of the interface between the substrate and the diamond layer is covered by diamond crystals, each diamond crystal having a contact area with the substrate of $\geq 20$ um².

10 Claims, 2 Drawing Sheets

CONTACT AREA ≥ 20μm²

CONTACT AREA ≥ 20μm²

METHOD OF DEPOSITING A POLYCRYSTALLINE DIAMOND LAYER ON A NITRIDE SUBSTRATE

BACKGROUND OF THE INVENTION

The invention relates to a substrate provided with a polycrystalline diamond layer.

Diamond is an interesting material which, owing to its excellent characteristics, can be used for many different purposes. Firstly, owing to its extreme hardness, it is used in abrasion tools; secondly, its particularly good thermal conductivity in conjunction with a high electrical resistance is utilized for dissipating heat from electronic components.

Diamond for the last-mentioned application is usually prepared by a polycrystalline diamond layer being deposited on a substrate, e.g. with the aid of PVD or CVD processes (Physical or Chemical Vapour Deposition).

In these deposition processes the diamond layer builds up by a very large number of small crystals being initially formed directly on the substrate surface and then growing together to produce a small number of large crystals in the subsequent growth process.

As it happens, measures are known for enabling the formation of as many crystals as possible, i.e. increasing the grain density on the substrate. As a result, the individual crystals will grow together more rapidly, so that the actual layer growth can start sooner and the entire growth process can thus be accelerated.

While these measures allow the thermal conductivity of the diamond layer as a whole to be improved, it is still not particularly satisfactory, for example in view of the high packing density of electronic components, in particular power components.

SUMMARY OF THE INVENTION

It is therefore an object of the invention to propose a substrate provided with a polycrystallize diamond layer which has particularly good thermal conductivity.

Another object of the invention is to specify a substrate of the abovementioned type, which exhibits good eat transfer from the substrate to the diamond layer.

Yet another object of the invention is to specify a substrate of the type mentioned at the outset, which can be prepared in a readily reproducible manner from various materials.

Furthermore it is an object of the invention to specify a substrate of the abovementioned type, in which the structure of the diamond layer can be modified in a simple manner.

This is achieved according to the invention by the substrate comprising: a metal such as e.g. W, Mo, Cu or the like or an alloy from these metals or a composite material formed from these metals and/or their compounds, examples of such a composite material being a W-Cu or a W-Ag composite material or an MMC (metal-matrix-composite) material, in particular one whose infiltration metal is Cu or one which has been reinforced by carbon fibres, or by the substrate being formed by a ceramic such as e.g. SiC, $Si_3N_4$, $Al_2O_3$, AlN or the like, and by at least 75% of the interface substrate/diamond being covered by diamond crystals which have a contact area substrate/diamond of $\geq 20$ $\mu m^2$.

As a result, only relatively few grain boundaries are able to form directly on the substrate surface, so that good thermal conductivity is achieved even within that region of the diamond layer which directly adjoins the substrate surface. The substrate materials specified have good thermal conductivity per se to start with, on the one hand, and are well-suited for being coated with diamond, on the other hand, so that they are suitable for being made into very good heat dissipation means for electronic components.

A further purpose of the invention is to specify a method for preparing a substrate provided with a polycrystalline diamond layer of the abovementioned type.

This is achieved, according to the invention, by the substrate surface being treated and by the diamond layer then being deposited on the substrate from the gas phase, e.g. by a CVD process such as hot-filament CVD or plasma CVD such as e.g. microwave CVD, plasma jet or the like or by a PVD process.

This procedure allows a diamond layer having the said characteristics to be deposited with good reproducibility on various substrates.

As a further feature of the invention, if a carbon- or carbide-reinforced MMC material is used as a substrate, the surface of the said MMC material may be covered with a covering metal layer, the metal layer preferably being formed from the infiltration metal itself.

It is thus possible, even with MMC substrates formed from two different materials (namely reinforcing material and infiltration metal), to achieve a homogeneous surface and thus growth thereon which is homogeneous across the said surface.

A preferred embodiment of the invention may consist in the substrate being treated by a chemical etching process.

Thus the substrate surface can be treated particularly effectively and to a precisely definable extent.

A particularly preferred embodiment of the invention may consist in the chemical etching process being carried out involving the use of an acid or an alkali.

With the aid of one of these two media, the surface quality required for the growth of diamond crystals having an average contact area $\geq 20$ $\mu m^2$ at the interface substrate/diamond can be achieved with high accuracy and good reproducibility.

A further refinement of the invention may provide for the chemical etching process to be carried out by means of a solution of potassium hydroxide or of sodium hydroxide having the concentration 10–90%, where appropriate 20–80%, preferably 30–70%, especially 40%–60%, or via a melt of KOH or of NaOH.

These alkalis can be prepared in a simple manner in the concentrations required.

In this context provision may be made for the etching process to be carried out at an ambient temperature of 10° –600° C., where appropriate of 100–500° C., preferably of 200°–500° C., especially of 300° C.–500° C.

These ambient temperatures can be generated and modified by simple means. Such modification enables the etching intensity and thus the surface quality desired to be influenced in a simple manner.

Provision may further be made, in this context, for the etching process to be carried out over a period of 0.5 s–60 min, where appropriate of 1 s–30 min, preferably of 1 s–10 min, especially of 5–60 s.

Varying the specified intervals again allows the surface quality actually achieved by the etching process to be modified in a simple manner, thus influencing the crystal density to be achieved.

It may be advantageous for the gas phase deposition to employ a mixture of hydrogen and hydrocarbon, especially a mixture of hydrogen and methane, because this is a particularly efficient carbon source and is convenient to prepare.

In this context provision may be made for a gas mixture to be used which has a hydrocarbon concentration of 0.25–2.5 vol%, especially of 0.5–1.5 vol%.

Provision may further be made for the substrate during the gas phase deposition to be maintained at a temperature of 600–950° C., especially at 800–900° C.

Both process conditions favour the build-up of a diamond layer according to the invention, in which at least 75% of the starting crystals at the boundary layer substrate/diamond have an average contact area of $\geq 20$ $\mu m^2$.

BRIEF DESCRIPTION OF THE DRAWING

The invention is explained below in more detail with the aid of the appended drawings, in which.

DETAILED DESCRIPTION OF PREFERRED EMBODIMENTS

The preparation of diamond requires relatively complex, time-consuming and therefore expensive processes. It is therefore particularly important that the diamond or diamond layers produced be formed with optimum characteristics, so that the cost-intensive effort is justified. If an application as a heat dissipation element or as part of such an element is intended, particularly good thermal conductivity in conjunction with minimum layer thickness should therefore be achieved by the diamond crystals being grown directly on the substrate, the heat dissipation elements' thermal conductivity in a direction perpendicular to the substrate surface being of interest in the preferred application fields of these elements.

The heat transport is effected by phonons which propagate particularly effectively within a diamond crystal. Wherever two or more crystals adjoin one another, grain boundaries 2 are present. These grain boundaries 2 represent "obstacles" for the phonons and thus reduce the thermal conductivity of the diamond layer.

The best thermal conductivity would therefore be achieved if the entire diamond layer were to consist of a single crystal. Such diamonds are quite impossible to produce, or only at enormous cost which cannot be justified economically, so that in practice it is necessary to make do with polycrystalline diamonds.

Figure 1A:
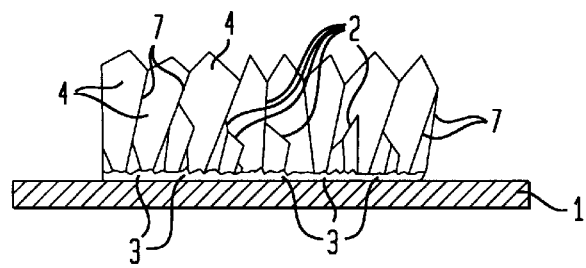
FIG. 1a shows an elevational, sectional view of a previously known polycrystalline diamond layer on a substrate.

The growth of such a diamond layer on a substrate 1 proceeds as follows: starting crystals 3 become established at substrate surface irregularities such as, in particular, grain boundaries of the substrate. As shown in FIG. 2a, these crystals undergo shell-wise growth until they abut against one another and form a covering layer. Once the said covering layer has been achieved, the diamond growth continues in the form of the so-called columnar crystals 4, i.e. crystals whose diameter steadily increases in the direction of growth (compare FIG. 1). In this situation, some of the starting crystals 3 continue to grow in the form of columnar crystals 4, whereas others are "overgrown". Such overgrowth results in grain boundaries 2 being formed between the columnar crystals 4, the orientation of the grain boundaries being essentially transverse to the propagation direction of the phonons.

Hitherto it had been thought that the thermal conductivity of the entire diamond layer was largely determined by those regions of the diamond layer which contain nothing but columnar crystals 4 and consequently almost exclusively grain boundaries 7 which are parallel to the heat dissipation direction. To ensure that the formation of the said columnar crystals 4 will commence as rapidly as possible, the aim has always been to rapidly generate the first covering layer, consisting of the starting crystals 3. As shown in FIG. 1a, this was achieved in accordance with the prior art by many possible attachment sites 5 for starting crystals 3 being provided on the substrate 1, for example by roughening it. At the same time, however, this promotes the formation of many columnar crystals 4, of which very many will be "overgrown" by adjacent crystals, so that grain boundaries 2 which obstruct the movement of phonons in the direction perpendicular to the substrate surface will inevitably be formed.

According to the invention, the number of the grain boundaries 2 which impair thermal conductivity is to be reduced by means of even the starting crystals 3, i.e. the diamond crystals on the interface substrate/diamond being caused to be of relatively large size. To express this in concrete numbers, the requirement is intended to be satisfied by virtue of at least 75% of the interface substrate/diamond being covered by diamond crystals which have a contact area substrate/diamond of $\geq 20$ $\mu m^2$.

To determine the magnitudes of the contact areas substrate/diamond crystals, a portion, selected so as to be representative, of the interface substrate/diamond of 100 $\mu m \times 100$ $\mu m$ is chosen and the contact areas substrate/diamond of the crystals located thereon are determined by planimetry (area measurement).

If such starting crystals 3 are formed, this results in the structure of the diamond layer shown in FIG. 1b, where large starting crystals 3 have already formed, subsequently resulting in large columnar crystals 4.

The diameter or the contact area substrate/diamond of the individual diamond crystals which are arranged in the transition region to the substrate (and therefore their density) can be influenced systematically by suitable treatment of the substrate surface. On an untreated "raw surface" a certain number of attachment sites 5 are present for the carbon atoms of the diamond crystals, and a corresponding number of small starting crystals 3 will therefore form. As described above, this number was considered too low in the prior art and was therefore increased by a physical or alternatively chemical pretreatment of the substrate 2.

For the purpose of the invention, however, exactly the opposite of this is aimed for, namely the formation of only a few starting crystals 3. This requires a substrate surface treatment by virtue of which the majority of the possible crystallization sites 5 is removed and only selected sites remain. This requirement is met by a chemical etching process which can be applied both to monocrystalline and to polycrystalline substrate materials.

Figure 3:
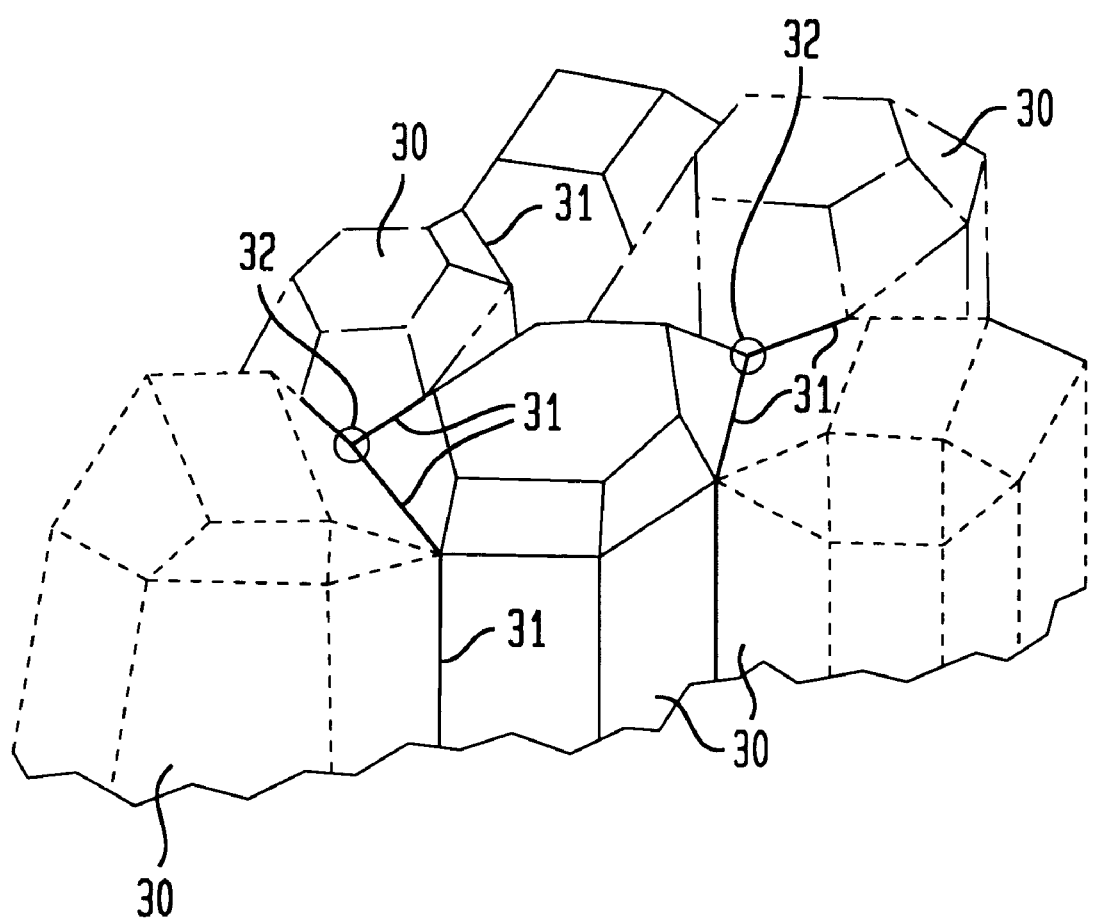
FIG. 3 shows a detail of the surface of a polycrystalline substrate in oblique view.

The said etching process is most easily explained with reference to FIG. 3, a representation of a polycrystalline AlN surface.

The individual crystals 30 are closely packed together, forming grain boundaries 31, precisely like diamond crystals. If an etching solution is used which preferentially attacks the material at these grain boundaries 31, crystallization sites 5 can be created there, so-called triple points 32, i.e. points where the boundary faces of three crystals 30 meet, being particularly preferred.

The etching process described can make use of an acid or an alkali, preference being given to the use of a solution of potassium hydroxide or of sodium hydroxide having the concentration 10–90%, where appropriate 20–80%, preferably 30–70%, especially 40%–60%, or via a melt of KOH or of NaOH.

With the aid of these etching operations, all the materials which can be used as a substrate, i.e. metal such as e.g. W, Mo, Cu or the like or alloys from these metals or a composite material formed from these metals and/or their compounds, such as e.g. a W-Cu or a W-Ag composite material or an MMC (metal-matrix-composite) material, in particular one whose infiltration metal is Cu or one which has been reinforced by carbon fibres, can be treated in a controlled manner.

In the context of W and Mo it should be noted, however, that the diamond deposition process gives rise to a carbide layer on the surface of these materials, and that the actual growth of diamond only commences on this carbide layer.

In the case of MMC composite components, especially those which are reinforced with carbide or carbon fibre, it is advantageous for the surface on which the diamond is to grow to be covered with a continuous metal covering layer which is preferably albeit not necessarily formed from the matrix metal of the composite material, and for thus the reinforcement material not to be allowed to be exposed on the component surface.

Where the said—carbon- or carbide-containing—reinforcing material is to be exposed and thus to be open to the carbon-containing deposition atmosphere, it would be decomposed by this atmosphere, with channels intruding into the surface being formed. The diamond deposition would then commence in the interior of the channels, and an unnecessarily long period would be required to fill these with diamond.

Further suitable substrate materials other than those already mentioned include ceramics such as e.g. Sic, $Si_3N_4$, $Al_2O_3$, AlN or the like.

The etching process takes place at an ambient temperature of 100–600° C., where appropriate of 100–500° C., preferably of 200°–500° C., especially of 300° C.–500° C. and is carried out over a period of 0.5 s–60 min, where appropriate of 1 s–30 min, preferably of 1 s–10 min, especially of 5–60 s.

The above etching solutions are particularly suitable, in combination with the abovementioned etching temperatures and times, for the controlled pretreatment of AlN substrates.

Varying one or more process parameters, i.e. extending or shortening the etching process, or altering the ambient temperature, makes it possible to vary the total number of the crystallization sites produced by etching, e.g. the triple points 32, and thereby their density and eventually the number of starting crystals 3. which are formed.

The etching operation is followed by the actual generation of the diamond layer by deposition from the gas phase. Various techniques can be used for this purpose. The deposition can be effected by a CVD (Chemical Vapour Deposition) process, any of the known process options, such as hot-filament CVD or plasma CVD such as e.g. microwave CVD, plasma jet or the like, being potentially applicable. A further gas phase deposition option is presented by a PVD (Physical Vapour Deposition) process, which can likewise be used for preparing a diamond layer according to the invention.

With these gas phase deposition processes, the material to be applied, which is present in the gaseous state in a carrier gas, is passed over the substrate at temperatures of 200–2000° C. and is deposited thereon.

Preference is given, in the process, to the use of hydrogen as the carrier gas and to a hydrocarbon such as, in particular, methane as the carbon source. The formation of starting crystals of the size according to the invention can be promoted by the methane concentration being selected in a range of 0.25–2.5 vol%, in particular in a range of 0.5–1.5 vol%. The range of the beneficial substrate temperature is between 600 and 950° C., in particular between 800 and 900° C.

Figure 1B:
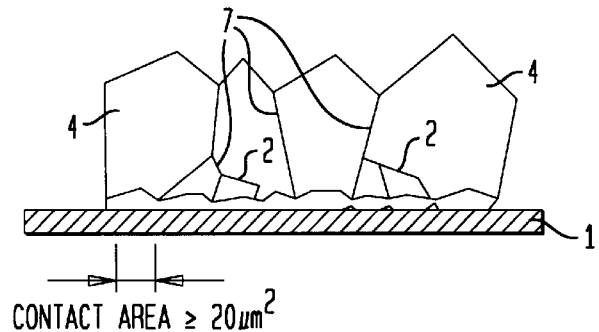
FIG. 1b shows an elevational, sectional view of a novel polycrystalline diamond layer.
Figure 2A:
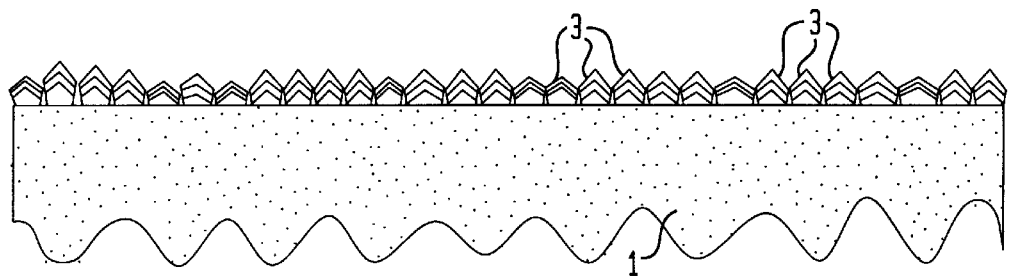
FIG. 2a shows a detail of the diamond layer according to FIG. 1a, again in an elevational view and depicted as a section.
Figure 2B:
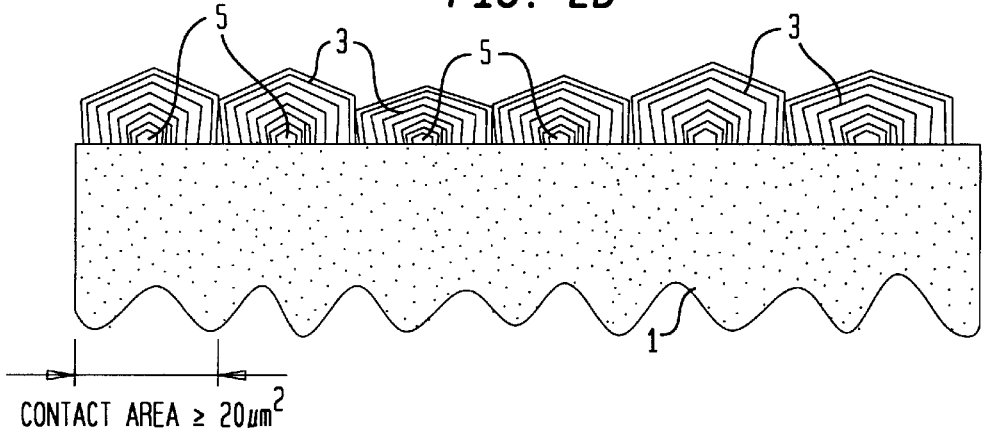
FIG. 2b shows a detail of a novel diamond layer according to FIG. 1b, in an elevational view and depicted as a section.

During the deposition process the starting crystals 3 grow as shown in FIG. 2b, starting from a few crystallization sites 5, in the form of large crystals of which at least 75% have a contact area substrate/diamond of $\geq 20$ $\mu m^2$, and then merge into columnar crystals 4 (compare FIG. 1b).

The deposited layer may in principle have any thickness. If the diamond layer is used as a heat dissipator for electronic components it is beneficial, however, for the diamond layer to be completely continuous at the surface (on which the component to be cooled is supported), the columnar crystals which stand next to one another like columns therefore already having grown completely together, so that heat transfer from the component to the diamond layer is ensured over the entire area. In this context, layer thicknesses of between 50 and 500 $\mu$m were found to be adequate. A concrete example which may be mentioned is that of laser diodes, where a thickness of 300 $\mu$m is employed with particular preference. The use of larger layer thicknesses is quite conceivable and sensible, however, for example for use in high-performance switching components which lend themselves, where necessary, to the switching even of pulse-shaped loads.

For the case of AlN, which lends itself particularly well to the deposition of diamond layers as described, and of some more of the substrate materials specified, concrete treatment procedures are described below which have led to the formation of diamond crystals of sizes according to the invention (contact area substrate/diamond $\geq 20$ $\mu m^2$).

EXAMPLE 1

(AlN)

The results achieved are especially good, in a qualitative sense, and in particular are well reproducible, if the AlN substrate is etched for 10 s in a hot, 400° C., 55% strength KOH solution and the diamond layer is then made to grow by means of a microwave or hot-filament CVD process. The carbon-containing gas used is a mixture of hydrogen and methane, the methane concentration being 0.75%; during the deposition process the AlN substrate has a temperature of 850° C.

EXAMPLE 2

(MMC composite materials)

Metal-matrix composite materials which are reinforced by particles or fibres can likewise be successfully pretreated by means of an etching process according to the invention. Of particular interest for electronics applications in this context are composite materials having a high thermal conductivity and low expansion. An example of such a composite material is copper reinforced with short carbon fibres, improved efficacy of the etching process according to the invention and above all of the diamond deposition following it being achieved in this case, as for all carbon- or carbide-reinforced metal-matrix composites, if the reinforcing material is completely covered with an at least thin metal layer.

In the case of the copper reinforced with short carbon fibres, the said copper having a superficial continuous covering layer of 0.1 mm copper, etching with 10% strength sulphuric acid at 50° C. for two hours was the first step, followed by thorough rinsing. Etching could also be performed quite effectively with mixtures of sulphuric acid and nitric acid or alternatively with pure nitric acid, although the etching time required is then very much shorter. For example, aqueous mixtures of 10% strength sulphuric acid and 2% strength nitric acid at 60° C. produced interesting results after as little as 60 seconds. The copper-carbon composite materials thus pretreated were then coated with diamond in a hot-filament or a microwave CVD process. Particularly favourable deposition conditions were found to be produced by substrate temperatures of 870° C. and methane concentrations of 1% in hydrogen.

EXAMPLE 3

(copper)

Example 2 described an MMC composite element which is covered superficially with a thin copper layer. The same treatment steps involving the same process parameters therefore apply to the deposition onto a copper substrate (without reinforcing material).

EXAMPLE 4

(molybdenum, tungsten)

Good utility for etching substrates formed from molybdenum, tungsten or their alloys was shown by a mixture:

hydrochloric acid (37% strength): nitric acid (65% strength): hydrofluoric acid (40% strength) in a volume ratio of 2:1:2.

Duration and temperature of the treatment are within the above-specified ranges, i.e. from seconds to minutes and from 10° C. to a few 100° C.

Alternatively, roughly the same results were achieved by means of "Murakami etching". This involved 10 g of potassium hydroxide being dissolved in 100 ml of distilled water, 10 g of potassium ferric cyanide being dissolved in 100 ml of distilled water and the two solutions being mixed together in a ratio of 1:1. Treatment time and temperature corresponded to that of the abovementioned acid etching. Diamond deposition as in Example 2.

EXAMPLE 4

($Al_2O_3$)

This material was pretreated by means of a mixture of distilled water and 40% strength hydrofluoric acid (mixing ratio 1:10) at temperatures of between 60° C. and 80° C. over a period of from 10 to 60 min. The diamond deposition was carried out by means of the parameters listed in Example 1.

EXAMPLE 6

($Si_3N_4$)

a) Etching treatment and deposition process as in Example 1 (AlN)

b) Etching treatment by means of a boiling mixture of distilled water and phosphoric acid (85% strength) in a volume ratio of 15:85 over a period of from 5 to 60 min. Deposition process again as in Example 1 (AlN).

EXAMPLE 7

(SiC):

Etching treatment by means of a melt of sodium bicarbonate or potassium bicarbonate at a temperature of 900° C., duration of between 1 and 60 min; deposition process as in Example 1 (AlN).

What is claimed is:

1. A process for making a substrate having a polycrystalline diamond layer and formed from a material selected from the group consisting of AlN and $Si_3N_4$, with at least 75% of the interface between the substrate and the diamond layer being covered by diamond crystals, each diamond crystal having a contact area with the substrate of $\geq 20$ $\mu m^2$, said process comprising the steps of chemically the substrate for 5 to 60 seconds by using a solution selected from the group consisting of potassium hydroxide and sodium hydroxide or by using a melt selected from the group consisting of KOH and NaOH having a concentration of 40 to 60%, said chemically etching process being carried out at an ambient temperature of 300 to 500° C.; and depositing the diamond layer on the substrate from a gas phase.

2. The process of claim 1 wherein said depositing step is carried by a method selected from the group consisting of CVD process and PVD process.

3. The process of claim 2 wherein the CVD process is selected from the group consisting of hot/filament CVD and plasma CVD.

4. The process of claim 3 wherein the plasma CVD is selected from the group consisting of microwave CVD and plasma jet.

5. The process of claim 1 wherein the gas phase deposition employs a mixture of hydrogen and hydrocarbon.

6. The process of claim 5 wherein the hydrocarbon is methane.

7. The process of claim 5 wherein a gas mixture having a hydrocarbon concentration of 0.25–2.5 vol% is used.

8. The process of claim 7 wherein the hydrocarbon concentration is 0.5–1.5 vol%.

9. The process of claim 5 wherein the substrate is maintained at a temperature of 600–950° C. during the gas deposition.

10. The process of claim 9 wherein the substrate is maintained at a temperature of 800–900° C. during the gas deposition.

* * * * *